United States Patent
Lee et al.

(10) Patent No.: US 11,552,146 B2
(45) Date of Patent: Jan. 10, 2023

(54) DISPLAY DEVICE

(71) Applicant: Samsung Display Co., Ltd., Yongin-si (KR)

(72) Inventors: Sanghoon Lee, Yongin-si (KR); Kinyeng Kang, Yongin-si (KR); Taewoo Kim, Yongin-si (KR); Taehoon Yang, Yongin-si (KR); Jonghyun Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 269 days.

(21) Appl. No.: 16/907,476

(22) Filed: Jun. 22, 2020

(65) Prior Publication Data

US 2021/0193746 A1 Jun. 24, 2021

(30) Foreign Application Priority Data

Dec. 20, 2019 (KR) .......................... 10-2019-0171892

(51) Int. Cl.
| | |
|---|---|
| *H01L 27/32* | (2006.01) |
| *G09G 3/3266* | (2016.01) |
| *G09G 3/3208* | (2016.01) |
| *H01L 27/15* | (2006.01) |

(52) U.S. Cl.
CPC ......... *H01L 27/326* (2013.01); *G09G 3/3208* (2013.01); *G09G 3/3266* (2013.01); *H01L 27/156* (2013.01); *H01L 27/3276* (2013.01)

(58) Field of Classification Search
CPC . H01L 27/326; H01L 27/156; H01L 27/3276; H01L 27/124; H01L 27/3246; H01L 27/3225; G09G 3/3208; G09G 3/3266; G09G 2300/0819; G09G 3/3233
See application file for complete search history.

(56) References Cited

U.S. PATENT DOCUMENTS

| | | | | |
|---|---|---|---|---|
| 10,134,826 | B2 * | 11/2018 | Ka | ........................... H01L 51/56 |
| 10,466,822 | B2 * | 11/2019 | Kim | ........................ G06F 3/041 |
| 10,756,136 | B1 * | 8/2020 | Ma | ........................ H01L 31/147 |

(Continued)

FOREIGN PATENT DOCUMENTS

| | | |
|---|---|---|
| EP | 3176771 A2 | 6/2017 |
| KR | 1020170117291 A | 10/2017 |

(Continued)

*Primary Examiner* — S M Sohel Imtiaz
(74) *Attorney, Agent, or Firm* — Cantor Colburn LLP

(57) ABSTRACT

A display device includes: a substrate including a display area including first and second pixels in a first row, and third and fourth pixels arranged in a second row parallel to the first row; a light-transmitting non-display area within the display area; first and second columns parallel to and spaced apart from each other, and each crossing the non-display area; and a plurality of lines including: first and second lines extending along the first row and connected to the first and second pixels, respectively, a first disconnection point where the first and second lines are spaced apart from each other, third and fourth lines extending along the second row and connected to the third and fourth pixels, respectively, and a second disconnection point where the third and fourth lines are spaced apart from each other, where the first and second disconnection points respectively correspond to the first and second columns.

20 Claims, 7 Drawing Sheets

(56) References Cited

U.S. PATENT DOCUMENTS

| | | | |
|---|---|---|---|
| 2017/0352843 A1* | 12/2017 | Kim | ................... G09G 3/3208 |
| 2018/0190190 A1* | 7/2018 | Xi | ..................... G09G 3/3208 |
| 2019/0043452 A1* | 2/2019 | Silvanto | ................ G09G 5/14 |
| 2019/0115415 A1 | 4/2019 | Choi et al. | |
| 2019/0371234 A1* | 12/2019 | Matsueda | ........... H01L 27/3218 |
| 2021/0408145 A1* | 12/2021 | Zhang | .............. H01L 27/3276 |

FOREIGN PATENT DOCUMENTS

| | | |
|---|---|---|
| KR | 1020180042351 A | 4/2018 |
| KR | 1020180063633 A | 6/2018 |
| KR | 1020190041553 A | 4/2019 |
| WO | 2017/172375 A1 | 10/2017 |

* cited by examiner

DISPLAY DEVICE

This application claims priority to Korean Patent Application No. 10-2019-0171892 filed on Dec. 20, 2019, and all the benefits accruing therefrom under 35 U.S.C. § 119, the disclosure of which is incorporated herein in its entirety by reference.

BACKGROUND

1. Field

One or more embodiments relate to a display device.

2. Description of Related Art

Use of display devices has diversified. In addition, as the display devices are becoming thinner and lighter, the range of use of the display devices is further increasing.

Various functions for connecting or linking a display device to other devices have been developed, along with enlargement of a planar area occupied by a display area of the display device.

SUMMARY

One or more embodiments include a display device including a component such as a camera or a sensor arranged corresponding to a display area. The display area includes a component area corresponding to the component and having a relatively high light transmittance for smooth operation of the component, as a method for the component to provide various functions for connecting or linking to a display device.

Additional features will be set forth in part in the description which follows and, in part, will be apparent from the description, or may be learned by practice of the presented embodiments of the disclosure.

According to an embodiment, a display device includes a substrate including a display area including a plurality of pixels including: a first pixel and a second pixel arranged along a first row, and a third pixel and a fourth pixel arranged along a second row parallel to the first row; a first non-display area within the display area and at which light is transmittable to and from the substrate; a first column defined perpendicular to the first row; and a second column defined parallel to the first column and spaced apart from the first column, where the first column and the second column each pass through the first non-display area; and a plurality of lines on the substrate and including: a first line extending along the first row and electrically connected to the first pixel, a second line extending along the first row and electrically connected to the second pixel, a first disconnection point at which the first line and the second line are spaced apart from each other along the first row, a third line extending along the second row and electrically connected to the third pixel, a fourth line extending along the second row and electrically connected to the fourth pixel, and a second disconnection point at which the third line and the fourth line are spaced apart from each other along the second row. The first disconnection point corresponds to the first column and the second disconnection point corresponds to the second column.

The first line and the third line each may extend from a first scan driving circuit arranged at one side of the substrate, and the second line and the fourth line each may extend from a second scan driving circuit arranged at an opposing side of the substrate.

The substrate may further include a second non-display area outside of the display area, and the first scan driving circuit and the second scan driving circuit may be arranged in the second non-display area.

The plurality of lines may include at least one of a scan line and a light emission control line.

The plurality of pixels may further include a fifth pixel and a sixth pixel arranged along a third row parallel to the first row, and the plurality of lines may further include a fifth line extending along the third row and electrically connected to the fifth pixel, a sixth line extending along the third row and connected to the sixth pixel, and a third disconnection point at which the fifth line and the sixth line are spaced apart from each other. The third disconnection point may correspond to a third column parallel to and spaced apart from the first column and passing through the first non-display area.

The plurality of pixels may further include a seventh pixel and an eighth pixel arranged along a fourth row parallel to the first row and spaced apart from each other by the first non-display area.

The fourth row may pass through the first non-display area.

The first line and the third line may have different lengths from each other.

The first line and the second line may have different lengths from each other.

The number of pixels connected to the first line may be different from the number of pixels connected to the third line.

Widths of the first line and the third line may correspond to lengths of the first line and the third line, respectively, such that planar areas of the first line and the third line are equal to each other.

The first disconnection point and the second disconnection point may be located between two neighboring pixels.

Each of the plurality of pixels may include a display element including a pixel electrode, an opposite electrode, and a light emission layer which is between the pixel electrode and the opposite electrode. The opposite electrode may be a single body corresponding to the display area and may define a hole corresponding to the first non-display area.

An embodiment of a display device includes: a substrate including a display area including a plurality of pixels; and a first non-display area within the display area and at which light is transmittable to and from the substrate; and a plurality of lines on the substrate and electrically connected to the plurality of pixels. Within the display area, the plurality of lines are extended along a first direction and parallel to each other, and are arranged adjacent to each other along the first direction and along a second direction crossing the first direction, the plurality of lines which are adjacent to each other along the first direction, are spaced apart from each other to define disconnection points, and each of the disconnection points corresponds to the first non-display area, along the second direction.

The disconnection points may be arranged in a zigzag pattern within the display area.

A portion of the plurality of lines may extend from the first scan driving circuit and a remaining portion of the plurality of lines may extend from the second scan driving circuit, to define the disconnection points.

The substrate may further include a second non-display area outside of the display area, and the first scan driving circuit and the second scan driving circuit may be in the second non-display area.

Two adjacent lines of the plurality of lines may have different lengths from each other taken from the first scan driving circuit to a disconnection point.

A width of a portion of the plurality of lines may correspond to a length thereof from the first scan driving circuit to a disconnection point such that planar areas of the portion of the plurality of lines are equal to each other.

The plurality of lines may include at least one of a scan line and a light emission control line.

BRIEF DESCRIPTION OF THE DRAWINGS

The above and other features, and advantages of embodiments of the disclosure will be more apparent from the following description taken in conjunction with the accompanying drawings, in which.

DETAILED DESCRIPTION

Figure 1:
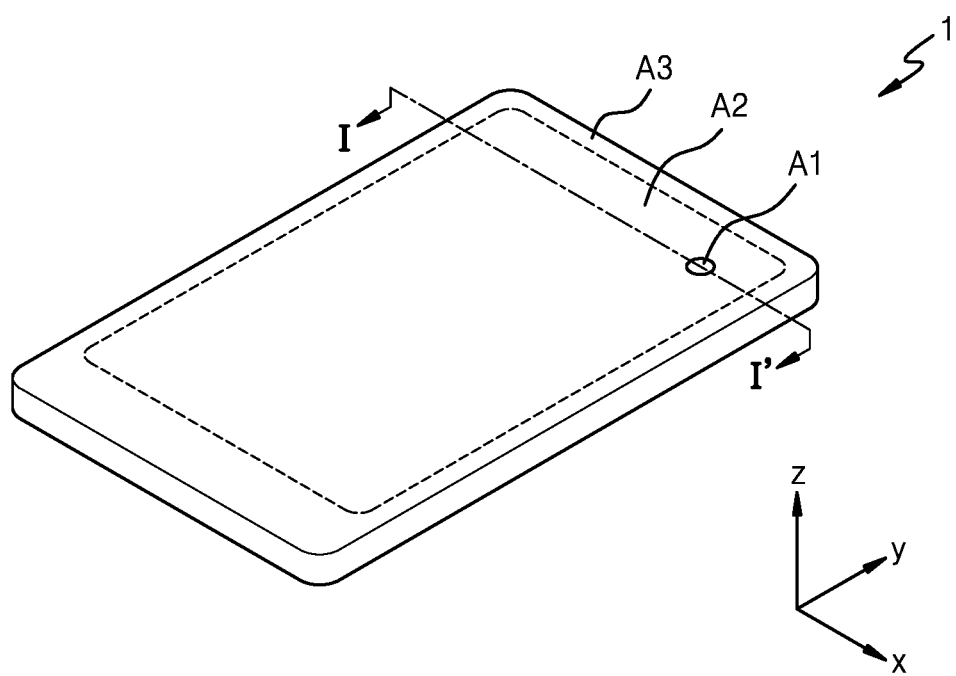
FIG. 1 is a schematic perspective view of an embodiment of an electronic display device.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain features of the present description.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

In the following embodiments, while such terms as "first," "second," etc., may be used to describe various elements, such elements must not be limited to the above terms.

In the following embodiments, an expression used in the singular encompasses the expression of the plural, unless it has a clearly different meaning in the context. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or."

In the following embodiments, it is to be understood that the terms such as "including" and "having" are intended to indicate the existence of the features, or elements disclosed in the present disclosure, and are not intended to preclude the possibility that one or more other features or elements may exist or may be added.

In the following embodiments, when a layer, region, or component is referred to as being related to another element such as being "on" another layer, region, or component, the layer, region, or component can be directly or indirectly on the other layer, region, or component. That is, for example, intervening layers, regions, or components may be present. In contrast, when a layer, region, or component is referred to as being related to another element such as being "directly on" another layer, region, or component, no intervening layers, regions, or components are present.

Sizes of components in the drawings may be exaggerated for convenience of explanation. In other words, since sizes and thicknesses of components in the drawings are arbitrarily illustrated for convenience of explanation, the following embodiments are not limited thereto.

When an embodiment may be implemented differently, a specific process order may be performed differently from the described order. For example, two consecutively described processes may be performed substantially at the same time or performed in an order opposite to the described order.

In the disclosure, "A and/or B" may include "A", "B", or "A and B". In addition, "at least one of A and B" may include "A", "B", or "A and B". Furthermore, "at least one of A, B, or C" may include "A", "B", "C", "at least one of A and B", "at least one of A and C", "at least one of B and C", or "A, B, and C".

It will be understood that when a layer, region, or component is referred to as being related to another element such as being connected to another layer, region, or component, it can be directly or indirectly connected to the other layer, region, or component. That is, for example, intervening layers, regions, or components may be present. For example, it will be understood that when a layer, region, or component is referred to as being electrically connected to another layer, region, or component, it can be directly or indirectly electrically connected to the other layer, region, or component. That is, for example, intervening layers, regions, or components may be present. In contrast, when a layer, region, or component is referred to as being related to another element such as being "directly connected" another layer, region, or component, no intervening layers, regions, or components are present Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The x, y, and z directions are not limited to three directions within the orthogonal coordinates system, and may be interpreted in a broad sense including the same. For example, the x, y, and z directions may be orthogonal to one another, but may refer to different directions that are not orthogonal to one another but do intersect or cross each other.

FIG. 1 is a schematic perspective view of an embodiment of a display device 1. The display device 1 and elements thereof may be disposed in a plane defined by a first direction and a second direction which intersect each other. In FIG. 1, for example, an x-direction and a y-direction may variously represent the first direction and the second direction. A thickness of the display device 1 and elements thereof, may be defined along a third direction (e.g., z-direction) which crosses each of the first direction and the second direction.

Referring to FIG. 1, the display device 1 may include a first area A1, a second area A2, and a third area A3. One or more layer or element of the display device 1 may include a first area A1, a second area A2, and a third area A3 corresponding to those described above for the display device 1.

The first area A1 may include a planar area corresponding to a component 20 included in the display device 1 and having a relatively high transmittance. In an embodiment, for example, the first area A1 may be understood as a transmission area through which light emitted from the component 20 or incident from outside the display device 1 (e.g., from a viewing side thereof) toward the component 20, may be transmitted. In an embodiment, for example, the first area A1 may be referred to as a light transmission area, a component area, a sensor area or an opening area OA.

The second area A2 may be defined as a planar area in which a pixel P provided in plurality (e.g., plurality of pixels P) is arranged. The display device 1 may provide image information from the second area A2, by using light generated and/or emitted from a plurality of pixels P arranged in the second area A2. In an embodiment, for example, the second area A2 may be referred to as a display area DA.

The second area A2 may be arranged adjacent to and at least partially surrounding the first area A1. In an embodiment, an entirety of the first area A1 may be surrounded by portions of the second area A2, as shown in FIG. 1. In a plan view, the first area A1 may be an enclosed area. A boundary may be defined between the first area A1 and the portions of the second area A2 which exclude a planar area of the first area A1.

The second area A2 may be located inside the third area A3. A boundary may be defined between the second area A2 and a remaining planar area of the third area A3 which excludes a planar area of the second area A2. A total planar area of the third area A3 may correspond to a planar area of the display device 1, without being limited thereto.

Referring to FIG. 1, for example, the first area A1 may be surrounded by the second area A2, and the second area A2 may be surrounded by the third area A3, in a top plan view along the z-direction.

The third area A3 may include a planar area in which circuit components providing electrical signals to pixels P arranged in the second area A2, are arranged.

In FIG. 1, the first area A1 and/or the third area A3 may correspond to a non-display area NDA. In an embodiment, the first area A1 and/or the third area A3 may exclude pixels P which generate and/or emit light. The first area A1 (e.g., first non-display area) and the third area A3 (e.g., second non-display area) may be planar areas at which an image is not displayed.

Although the first area A1 is illustrated as being arranged on one side (e.g., right side) of the second area A2 having a substantially rectangular shape in FIG. 1, the disclosure is not limited thereto.

In an embodiment, for example, a planar shape of the first area A1 may be a circle, or a polygon such as a triangle or a pentagon, and the position and number of the first area A1 within the display device 1 may be variously changed. In an embodiment, for example, the first area A1 may be arranged on an upper left side of the display device 1, based on a plane (for example, an x-y plane) of the second area A2, and a plurality of first areas A1 may be located inside a total planar area of the second area A2 which is defined by an outer edge thereof closest to the third area A3.

Hereinafter, although an embodiment of an organic light-emitting device is described as an example of the display device 1, the display device 1 of the present disclosure is not limited thereto.

In another embodiment, for example, the display device 1 may be an inorganic light-emitting display device (inorganic light emitting display or inorganic electroluminescent ("EL") display device) or a quantum dot light-emitting display device.

In an embodiment, for example, an emission layer of a display element OLED included in the display device 1 may include an organic material, an inorganic material, a quantum dot, an organic material and a quantum dot, or an inorganic material and a quantum dot.

The display device 1 described above may be or be included within various types of electronic devices such as a mobile phone, a notebook computer, and a smart watch.

Figure 2:
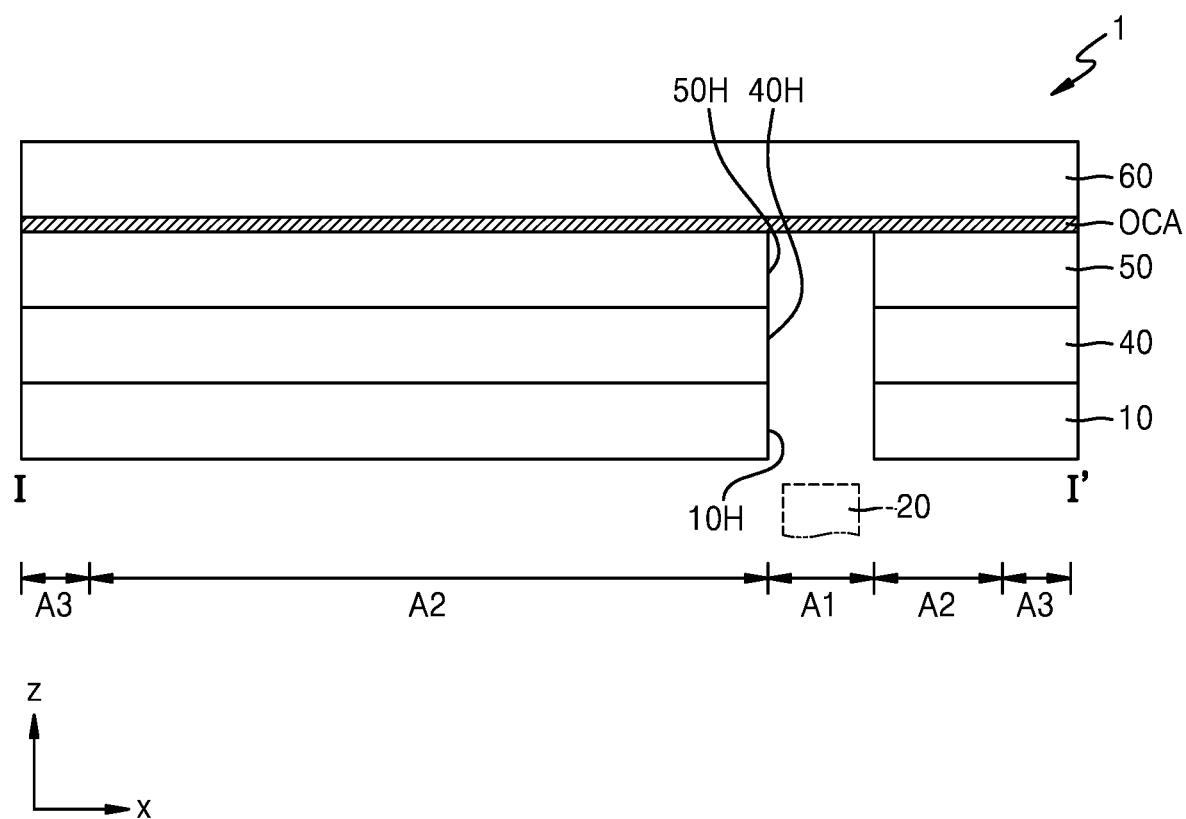
FIG. 2 is a cross-sectional view of an embodiment of a display device.

FIG. 2 is an enlarged cross-sectional view of the display device 1. FIG. 2 may correspond to a cross section of the display device 1 taken along line I-I'.

Referring to FIG. 2, the display device 1 may include a display panel 10, an input sensing layer 40 and/or an optical functional layer 50 arranged on the display panel 10, and these configurations may be covered by a window 60.

The window 60 may be combined with an underlying structure or stack of element layers, such as the optical functional layer 50 (or the input sensing layer 40), through a fixing member (or fixing layer) such as an adhesive layer OCA. The adhesive layer OCA may include an optical clear adhesive.

The display device 1 may include a component 20 under the display panel 10. The component 20 may face the window 60, with the underlying structure or stack of element layers therebetween. The component 20 may be disposed at a side of the display panel 10 which is opposite to a viewing side thereof.

The component 20 may include an electronic element using light to perform a function (e.g., a functional component or functional device) within the display device 1. In an embodiment, for example, the component 20 may include an electronic device using light in various wavelength bands, such as visible light, infrared light, ultraviolet light or the like, to perform a function. In an embodiment, for example, the component 20 may include a camera module that obtains image information by using light incident to the component 20 from outside the component 20 and/or the display device 1.

The display panel 10 may provide an image to outside the display panel 10, through light output from pixels P. The display panel 10 may generate and/or emit light to provide the image. A plurality of pixels P may be arranged in the second area A2, and each of the plurality of pixels P may include a display element OLED and a pixel circuit PC which is connected to the display element OLED. The display element OLED may include, for example, an organic light-emitting diode or a quantum dot organic light-emitting diode.

The input sensing layer 40 may be arranged on the display panel 10. The display panel 10 may face the window 60 with the input sensing layer 40 therebetween. The input sensing layer 40 may sense and/or generate coordinate information according to an external input, for example, a touch event to the display device 1 or an element thereof.

The input sensing layer 40 may include a sensing electrode (or a touch electrode) and trace lines which are connected to the sensing electrode. The input sensing layer 40 may sense an external input by a mutual capacitance method or a self-capacitance method.

In an embodiment, the input sensing layer 40 may be provided or formed separately from the display panel 10, and then adhered to the display panel 10 through a separate adhesive layer such as an optical clear adhesive. In another embodiment, the input sensing layer 40 may be directly provided or formed on the display panel 10. In an embodiment, for example, the input sensing layer 40 may be provided or formed on the display panel 10 continuously after an operation of forming the display panel 10. In this case, the input sensing layer 40 may be understood as a portion of the display panel 10, and an adhesive layer for attaching the input sensing layer 40 and the display panel 10 to each other may be obviated.

Although the input sensing layer 40 may be located between the display panel 10 and the optical functional layer 50 as shown in FIG. 2, the input sensing layer 40 may be arranged above the optical functional layer 50. That is, the display panel 10 may face the input sensing layer 40 with the optical functional layer 50 therebetween.

The optical functional layer 50 may include an anti-reflection layer. The anti-reflection layer may reduce the reflectance of light incident from outside the display panel 10 and/or the display device 1, and toward the display panel 10 through the window 60 from a viewing side of the display device 1. The anti-reflection layer may include a retarder and/or a polarizer.

The retarder may be a film type or a liquid-crystal coating type, and may include a λ/2 retarder and/or a λ/4 retarder. The polarizer may be a film type or a liquid-crystal coating type. The film-type polarizer may include a stretch-type synthetic resin film, and the liquid-crystal-coating-type polarizer may include liquid crystals. The retarder and the polarizer may further include a protective film. In an embodiment, for example, the retarder and the polarizer or the protective film may be defined as a base layer of the anti-reflection layer. In another embodiment, the anti-reflection layer may include a black matrix and color filters. The color filters may be arranged considering a color of light emitted from each of the pixels P of the display panel 10.

In another embodiment, the anti-reflection layer may include a destructive interference structure. The destructive interference structure may include a first reflective layer and a second reflective layer arranged in different layers from each other, e.g., a stacked structure along the thickness direction. First reflected light and second reflected light reflected from the first reflective layer and the second reflective layer, respectively, may destructively interfere, and thus, the reflectance of external light may be reduced.

The optical functional layer 50 may include a lens layer. The lens layer may improve light emission efficiency of light emitted from the display panel 10 and/or reduce color deviation. The lens layer may include a layer having a concave or convex lens shape, and/or may include a plurality of layers having different refractive indices from each other. The optical functional layer 50 may include each of the anti-reflection layer and the lens layer described above, or may include a single one of the anti-reflection layer and the lens layer.

In an embodiment, the optical functional layer 50 may be provided or formed continuously after an operation of providing forming the display panel 10 and/or the input sensing layer 40. In this case, an adhesive layer for attaching the optical functional layer 50, the display panel 10 and/or the input sensing layer 40 to each other may be obviated.

The display panel 10, the input sensing layer 40 and/or the optical functional layer 50 may include or define openings corresponding to the first area A1. In this regard, a structure in which the display panel 10, the input sensing layer 40 and the optical functional layer 50 respectively include or define a first hole 10H, a second hole 40H and a third hole 50H (e.g., first to third holes 10H, 40H, and 50H), and in which the first to third holes 10H, 40H, and 50H overlap or are aligned with each other, is shown in FIG. 2. The first to third holes 10H, 40H, and 50H which are aligned with each other, may provide a continuous opening or hole corresponding to the component 20.

In another embodiment, at least one of the display panel 10, the input sensing layer 40 and the optical functional layer 50 may not include a hole. In an embodiment, for example, any one or two features among the display panel 10, the input sensing layer 40 and the optical functional layer 50 may not include a hole.

When the display device 1 is used as a smartwatch or an instrument panel for vehicles, the component 20 may be a member such as a clock hand or a needle indicating information (for example, the speed of a vehicle or the like). When the display device 1 includes the clock hand or the instrument panel for vehicles, the component 20 may be exposed to outside the display device 1. In this case, the window 60 may further include or define an opening corresponding to the first area A1, unlike FIG. 2.

As described above, the component 20 may include one or more component 20 related to a function of the display panel 10, or may include an accessory which increases the aesthetics of the display panel 10 or the display device 1.

Figure 3:
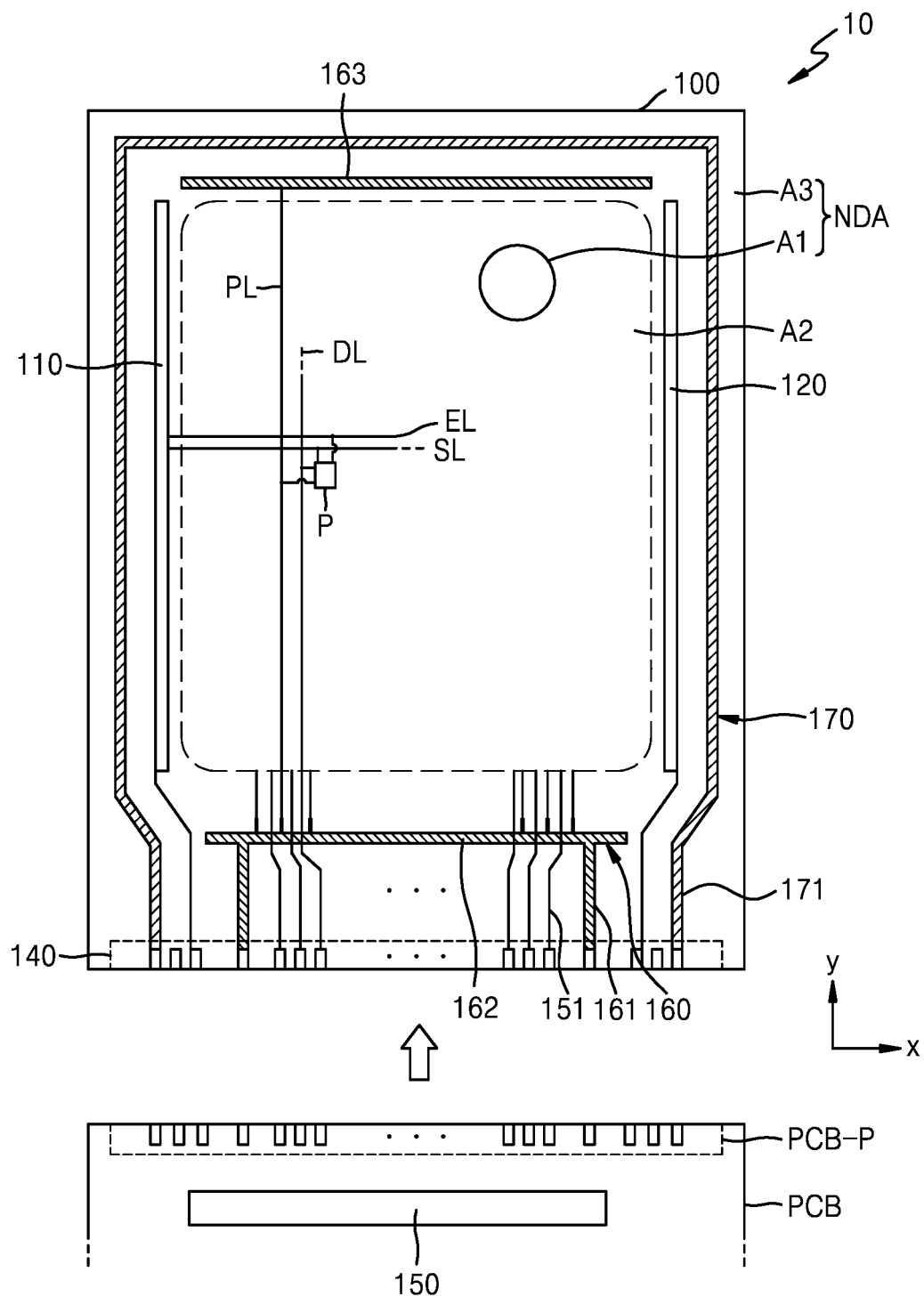
FIG. 3 is a schematic plan view of an embodiment of a display panel.
Figure 4:
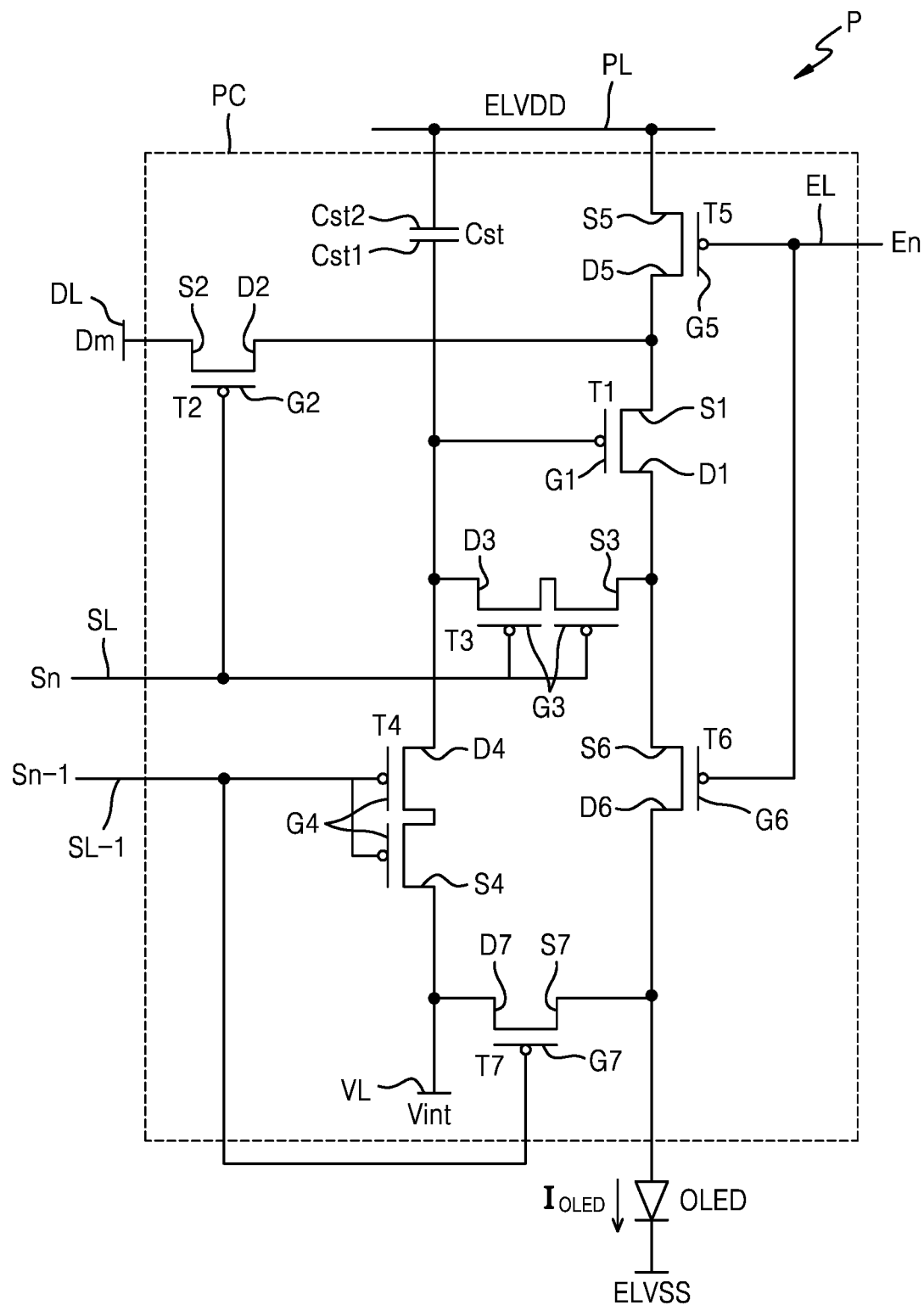
FIG. 4 is an equivalent circuit diagram of an embodiment of a pixel included in a display panel.

FIG. 3 is a schematic plan view of an embodiment of the display panel 10, and FIG. 4 is an equivalent circuit diagram of an embodiment of a pixel P included in the display panel 10 according to an embodiment.

Referring to FIGS. 3 and 4, the display panel 10 may include a plurality of pixels P arranged in the second area A2 (e.g., outer boundary indicated by a dotted line). The pixels P may include a display element OLED such as an organic light-emitting diode. Each pixel P may generate and/or emit one or more colored light among red, green, blue, or white light, through operation of the organic light-emitting diode (e.g., as a light emitting element or light emitting device). As described above, the pixel P may be a pixel P which emits one or more colored light among red, green, blue, or white light.

As shown in FIG. 4, the pixel P may include a pixel circuit PC and a display element OLED which is electrically connected to the pixel circuit PC. The pixel circuit PC may include a plurality of thin-film transistors and a storage capacitor Cst. The plurality of thin-film transistors and the storage capacitor Cst may be connected to signal lines SL, SL−1, EL, and DL through which an electrical signal is transmitted, an initialization voltage line VL, and the driving voltage line PL.

The plurality of thin-film transistors may include a driving thin-film transistor ("TFT") T1, a switching TFT T2, a compensation TFT T3, a first initialization TFT T4, an operation control TFT T5, an emission control TFT T6, and a second initialization TFT T7.

The signal lines may include a scan line SL transferring an electrical signal such as a scan signal Sn, a previous scan line SL−1 transferring an electrical signal such as a previous scan signal Sn−1 to the first initialization TFT T4 and the second initialization TFT T7, an emission control line EL (e.g., light emission control line) transferring an electrical signal such as an emission control signal En to the operation control TFT T5 and the emission control TFT T6, and a data line DL crossing the scan line SL and transferring an electrical signal such as a data signal Dm.

The driving voltage line PL may transfer an electrical signal such as a driving voltage ELVDD to the driving TFT T1. The initialization voltage line VL may transfer an electrical signal such as an initialization voltage Vint initializing the driving TFT T1 and a pixel electrode 350 of the display element OLED.

A driving gate electrode G1 of the driving TFT T1 may be connected to a first storage capacitor plate Cst1 of a storage capacitor Cst, a driving source electrode S1 of the driving TFT T1 may be connected to the driving voltage line PL via the operation control TFT T5, and a driving drain electrode D1 of the driving TFT T1 may be electrically connected to the pixel electrode 350 of the display element OLED via the emission control TFT T6. The driving TFT T1 may receive the data signal Dm according to a switching operation of the switching TFT T2 and supply an electrical driving current IDLED to the display element OLED.

A switching gate electrode G2 of the switching TFT T2 may be connected to the scan line SL, a switching source electrode S2 of the switching TFT T2 may be connected to the data line DL, a switching drain electrode D2 of the switching TFT T2 may be connected to the driving source electrode S1 of the driving TFT T1 and connected to the driving voltage line PL via the operation control TFT T5. The switching TFT T2 may be turned on according to the scan signal Sn received through the scan line SL and may perform a switching operation of transferring the data signal Dm transferred to the data line DL, to the driving source electrode S1 of the driving TFT T1.

A compensation gate electrode G3 of the compensation TFT T3 may be connected to the scan line SL, and a compensation source electrode S3 of the compensation TFT T3 may be connected to the driving drain electrode D1 of the driving TFT T1 and connected to the pixel electrode 350 of the display element OLED via the emission control TFT T6. A compensation drain electrode D3 of the compensation TFT T3 may be connected to the first storage capacitor plate Cst1 of the storage capacitor Cst, a first initialization drain electrode D4 of the first initialization TFT T4, and the driving gate electrode G1 of the driving TFT T1. The compensation TFT T3 may be turned on according to the scan signal Sn received through the scan line SL and electrically connected to the driving gate electrode G1 and the driving drain electrode D1 of the driving TFT T1 to compensate the driving TFT T1.

A first initialization gate electrode G4 of the first initialization TFT T4 may be connected to the previous scan line SL−1, and a first initialization source electrode S4 of the first initialization TFT T4 may be connected to a second initialization drain electrode D7 of the second initialization TFT T7 and the initialization voltage line VL. A first initialization drain electrode D4 of the first initialization TFT T4 may be connected to the first storage capacitor plate Cst1 of the storage capacitor Cst, the compensation drain electrode D3 of the compensation TFT T3, and the driving gate electrode G1 of the driving TFT T1. The first initialization TFT T4 may be turned on according to the previous scan signal Sn−1 received through the previous scan line SL−1 and transfer the initialization voltage Vint to the driving gate electrode G1 of the driving TFT T1 to initialize a voltage of the driving gate electrode G1 of the driving TFT T1.

An operation control gate electrode G5 of the operation control TFT T5 may be connected to the emission control line EL, and an operation control source electrode S5 of the operation control TFT T5 may be connected to the driving voltage line PL. An operation control drain electrode D5 of the operation control TFT T5 may be connected to the driving source electrode S1 of the driving TFT T1 and the switching drain electrode D2 of the switching TFT T2.

An emission control gate electrode G6 of the emission control TFT T6 may be connected to the emission control line EL, and an emission control source electrode S6 of the emission control TFT T6 may be connected to the driving drain electrode D1 of the driving TFT T1 and the compensation source electrode S3 of the compensation TFT T3. An emission control drain electrode D6 of the emission control TFT T6 may be electrically connected to a second initialization source electrode S7 of the second initialization TFT T7 and the pixel electrode 350 of the display element OLED.

The operation control TFT T5 and the emission control TFT T6 may be turned on according to the emission control signal En received through the emission control line EL and the driving voltage ELVDD may be transferred to the display element OLED to allow the electrical driving current IOLED to flow through the display element OLED.

A second initialization gate electrode G7 of the second initialization TFT T7 may be connected to the previous scan line SL−1, and the second initialization source electrode S7 of the second initialization TFT T7 may be connected to the emission control drain electrode D6 of the emission control TFT T6 and the pixel electrode 350 of the display element OLED. The second initialization drain electrode D7 of the second initialization TFT T7 may be connected to the first initialization source electrode S4 of the first initialization TFT T4 and the initialization voltage line VL. The second initialization TFT T7 may be turned on according to the previous scan signal Sn−1 received through the previous scan line SL−1 and initialize the pixel electrode 350 of the display element OLED.

Although FIG. 4 illustrates that the first initialization TFT T4 and the second initialization TFT T7 are connected to the previous scan line SL−1, the present disclosure is not limited thereto. In another embodiment, the first initialization TFT T4 may be connected to the previous scan line SL−1 and may be driven according to the previous scan signal Sn−1, and the second initialization TFT T7 may be connected to a separate signal line (for example, a following scan line) and may be driven according to a signal transferred to the signal line.

A second storage capacitor plate Cst2 of the storage capacitor Cst may be connected to the driving voltage line PL, and an opposite electrode 370 of the display element OLED may be connected to and receive a common voltage ELVSS. Accordingly, the display element OLED may output an image by emitting light by receiving the electrical driving current IOLED from the driving TFT T1.

Although FIG. 4 illustrates that the compensation TFT T3 and the first initialization TFT T4 have dual gate electrodes, the compensation TFT T3 and the first initialization TFT T4 may have one gate electrode.

Referring back to FIG. 3, each pixel P may be electrically connected to a driving circuit arranged in a non-display area NDA. In an embodiment, for example, the driving circuit may be in the third area A3 surrounding the second area A2. At least one of a first scan driving circuit 110 (e.g., first driving circuit), a second scan driving circuit 120 (e.g., second driving circuit), a first terminal 140 (e.g., first terminal area), a data driving circuit 150 (e.g., third driving circuit), a first power supply line 160 and a second power supply line 170 may be arranged in the third area A3.

The first scan driving circuit 110 may provide a scan signal Sn to each pixel P through the scan line SL. The first scan driving circuit 110 may provide an emission control signal En to each pixel P through the emission control line EL.

The second scan driving circuit 120 may be arranged parallel with the first scan driving circuit 110, with the second area A2 between the second scan driving circuit 120 and the first scan driving circuit 110.

A first portion of the pixels P arranged in the second area A2 may be electrically connected to the first scan driving circuit 110. A second portion of the pixels P which are not connected to the first scan driving circuit 110, may be electrically connected to the second scan driving circuit 120.

In another embodiment, either one of the first scan driving circuit 110 or the second scan driving circuit 120 may be omitted.

The first terminal 140 may be arranged at one side of a lower substrate 100. The first terminal 140 may be exposed to outside the display panel 10, such as by not being covered by an insulating layer, and may be electrically connected to a printed circuit board PCB external to the display panel 10. A second terminal PCB-P (e.g., second terminal area) of the printed circuit board PCB may be electrically connected to the first terminal 140 of the display panel 10.

The printed circuit board PCB may transmit an electrical signal or an electrical power of a controller (not shown), to the display panel 10. The printed circuit board PCB may transmit an electrical signal such as a control signal generated by the controller, to the first scan driving circuit 110 and the second scan driving circuit 120. That is, an electrical signal may be transmitted to the display panel 10 at the first terminal 140, from outside the display panel 10, through the second terminal PCB-P, without being limited thereto. Each of the first terminal 140 and the second terminal PCB-P may include a terminal pad through which the electrical signal is transmitted. The terminal pad may be provided in plurality within a respective terminal or terminal area.

The controller may respectively provide a first power supply voltage (e.g., driving voltage ELVDD) and a second power supply voltage (e.g., common voltage ELVSS) to the first power supply line 160 and the second power supply line 170, through a first connection line 161 and a second connection line 171, respectively.

The first power supply voltage may be provided to each pixel P through the driving voltage line PL connected to the first power supply line 160, and the second power supply voltage may be provided to the opposite electrode 370 of each pixel P connected to the second power supply line 170.

The data driving circuit 150 may be electrically connected to the data line DL. A data signal Dm of the data driving circuit 150 may be provided to each pixel P through a connection line 151 connected to the first terminal 140 and the data line DL connected to the connection line 151.

Although FIG. 3 illustrates that the data driving circuit 150 is arranged in the printed circuit board PCB, the data driving circuit 150 may be arranged within the display panel 10, such as on the lower substrate 100 in another embodiment. In an embodiment, for example, the data driving circuit 150 may be arranged between the first terminal 140 and the first power supply line 160.

The first power supply line 160 may include a first sub-line 162 and a second sub-line 163 both extending parallel to an x-direction with the second area A2 between the first sub-line 162 and the second sub-line 163. The driving voltage line PL may extend to cross the second area A2 and be connected to the first sub-line 162 and the second sub-line 163. The driving voltage line PL may connect the first sub-line 162 and the second sub-line 163 to each other. The second power supply line 170 may partially surround the second area A2 in a loop shape, with one side open (e.g., bottom of the view in FIG. 3). As described above, the first power supply line 160 may provide the first power supply voltage to each pixel P, and the second power supply line 170 may provide the second power supply voltage to each pixel P.

Figure 5:
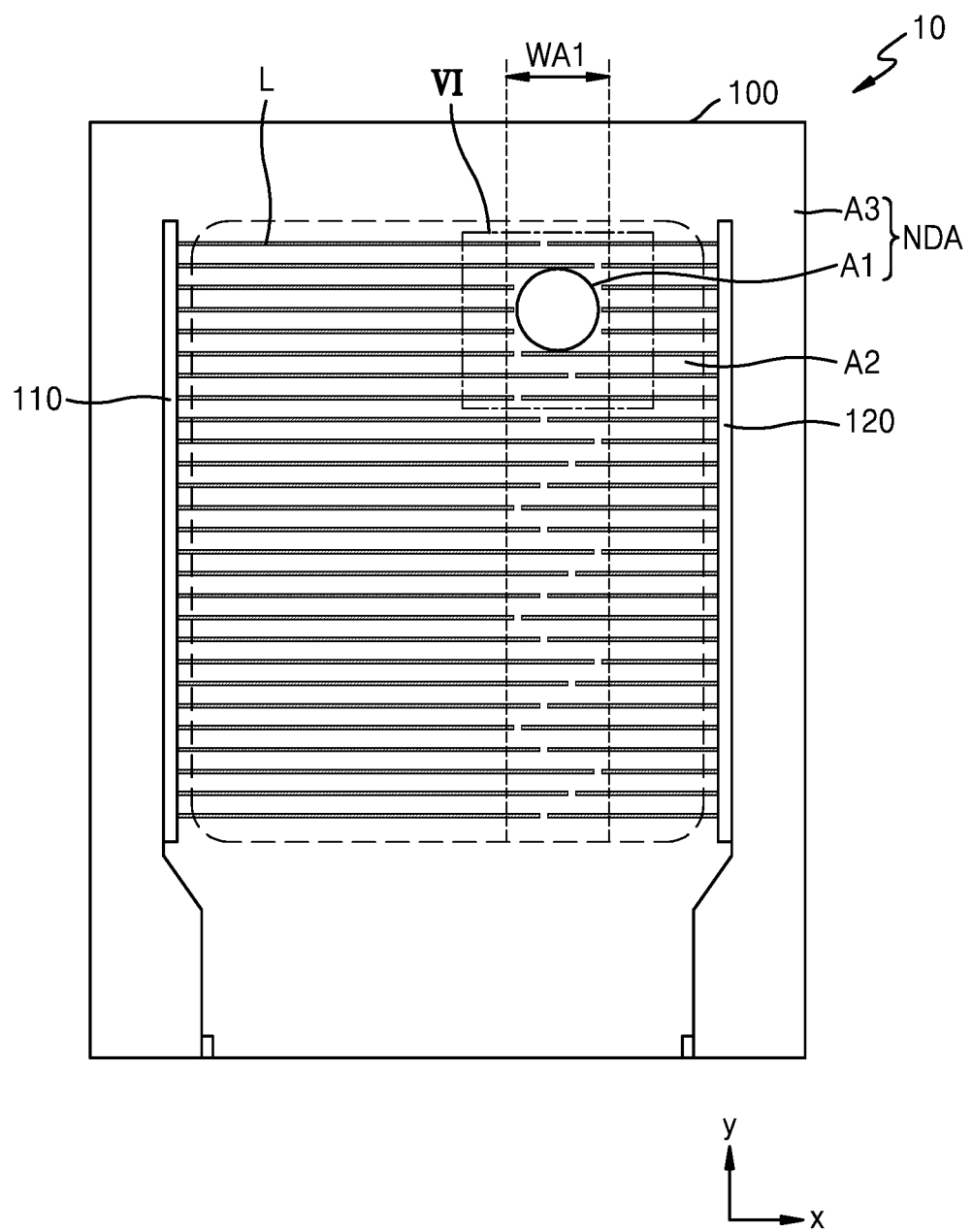
FIG. 5 is a plan view of an embodiment of a display panel.
Figure 6:
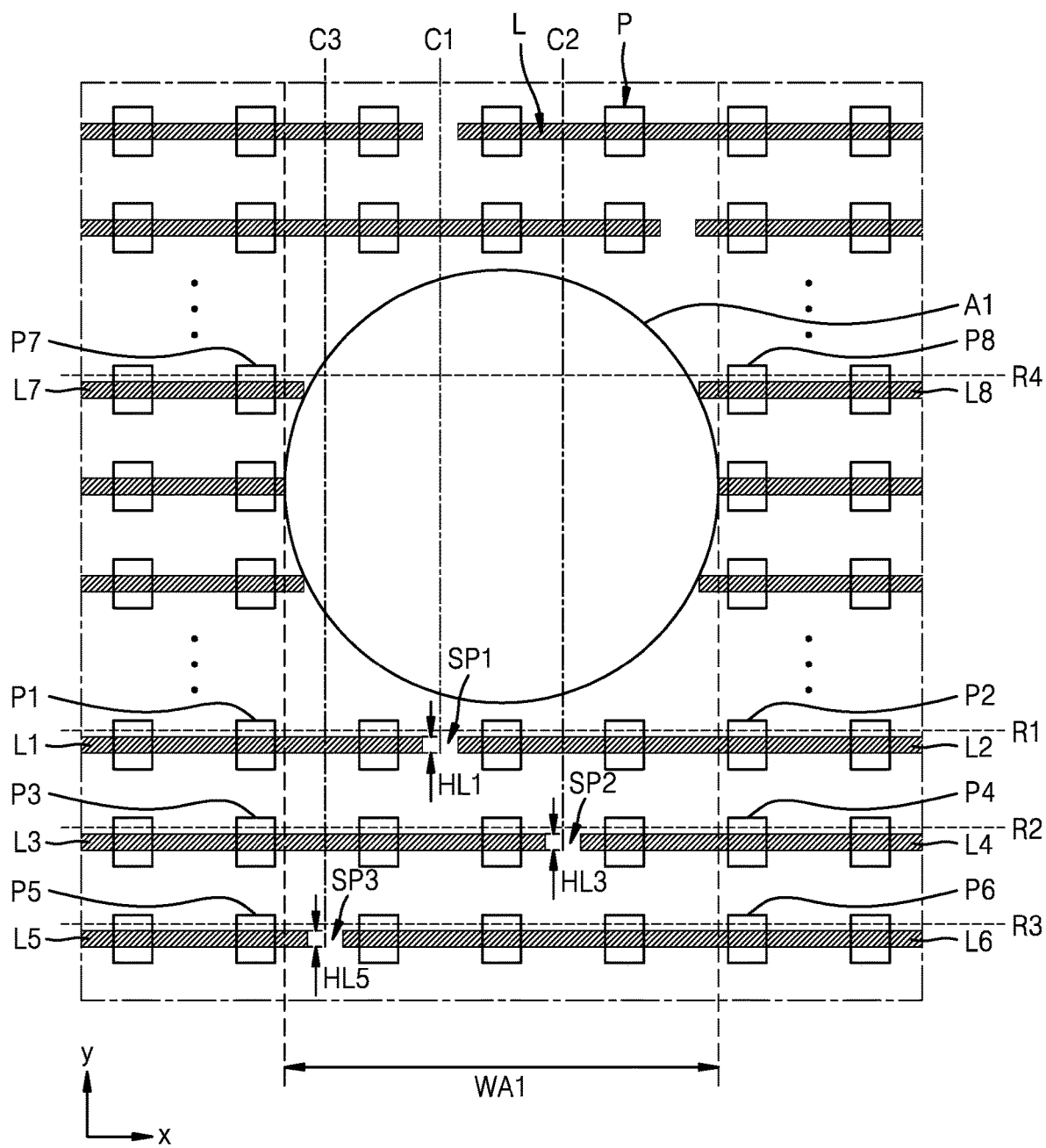
FIG. 6 is an enlarged top plan view of an embodiment of portion VI of the display panel of FIG. 5.

FIG. 5 is a top plan view of an embodiment of the display panel 10 and is a diagram illustrating in detail an arrangement structure of a line L arranged in plurality (e.g., plurality of lines L) in the display panel 10 of FIG. 3. FIG. 6 is an enlarged top plan view of region VI of the display panel 10 of FIG. 5.

Referring to FIGS. 5 and 6, the display panel 10 may include driving circuits arranged in the third area A3 of the lower substrate 100, and a plurality of lines L which extend from the driving circuits and are electrically connected to the pixels P arranged in the second area A2.

In an embodiment, for example, the plurality of lines L may include at least one of the scan line SL, the emission control line EL, the data line DL, the driving voltage line PL and the initialization voltage line VL described with reference to FIGS. 3 and 4.

The first scan driving circuit 110 and the second scan driving circuit 120 being arranged in the third area A3, and the plurality of lines L extending from the first scan driving circuit 110 or the second scan driving circuit 120 and into the second area A2, are illustrated in FIG. 5. In this case, the plurality of lines L may correspond to at least one of the scan line SL and the emission control line EL.

The first area A1 may be located inside a planar area the second area A2 of the lower substrate 100. The first area A1 is a planar area corresponding to the component 20 (see FIG. 2) included below the display panel 10 and having a relatively high transmittance, and the pixel P or lines L which are connected to the pixel P may not be arranged in the first area A1. As having relatively high transmittance, a light transmittance through the layers of the display panel 10 at the first area A1, may be greater than a light transmittance through the layers of the display panel 10 at other areas such as the second area A2 and/or the third area A3, without being limited thereto.

The lines L connected to the pixels P arranged in the second area A2, may bypass the first area A1 to be outside of the first area A1 in the top plan view. Referring to FIG. 5 and FIG. 6, the lines L are extended along the x-direction to define an extension direction of the lines L. In an embodiment, a line L may extend along an outer edge of the first area A1 to be adjacent to the first area A1 along the y-direction, or may terminate at the outer edge of the first area A1 to be disconnected from another line L. An end of a line L may be correspond to the outer edge of the first area A1, and may meet the outer edge of the first area A1, without being limited thereto.

When a plurality of lines L bypass the first area A1 by being arranged at a periphery portion of the first area A1 along the outer edge of the first area A1, a non-display area NDA due to the bypassed lines may be defined or formed at the periphery portion of the first area A1. Accordingly, in one or more embodiments, a portion of the plurality of lines L may be disconnected at a boundary of the first area A1 to reduce the non-display area NDA and maximize a planar area of the second area A2 in which the pixel P is arranged.

The first area A1 may be arranged at one side of the second area A2. In an embodiment, for example, the first area A1 may be arranged to be offset to the left side or right side of the lower substrate 100 of the display panel 10 with respect to a center of the lower substrate 100.

When the first area A1 is arranged at one side of the second area A2 and at least one line of the scan line SL and the emission control line EL is disconnected at the first area A1, resistive-capacitive ("RC") delay according to a difference in lengths between two lines L respective on the left and right with respect to a disconnected point of the lines L may occur. Each pixel P connected to respective ones of the lines L which are disconnected from each other, may have a different brightness feature.

In an embodiment, for example, when the first area A1 is arranged at a right-side inside the second area A2 as shown in FIG. 5, a pixel P connected to a disconnected line portion on the left side of the first area A1 may output light having a relatively greater brightness value under the same light output condition than a pixel P connected to a disconnected line portion on the right side of the first area A1.

Accordingly, a compensation design, for example, gamma compensation may be applied to the display panel 10 to minimize a difference in brightness between pixels P at opposing sides of a disconnected point due the disconnected line portions.

According to various embodiments of the present disclosure, the display panel 10 may have a structure in which all the lines L arranged in the second area A2 are disconnected to more easily apply the compensation design.

As shown in FIGS. 5 and 6, the plurality of lines L may extend in parallel to each other along a first direction (for example, an x-direction) and may be electrically connected to the pixels P arranged in a row along the first direction corresponding to each line L.

Referring to FIGS. 5 and 6, within the display area (e.g., second area A2), the plurality of lines L are extended along a first direction (e.g., the x-direction) and parallel to each other, and are arranged adjacent to each other along the first direction and along a second direction (e.g., the y-direction) crossing the first direction. The plurality of lines L which are adjacent to each other along the first direction, are spaced apart from each other to define disconnection points, and each of the disconnection points corresponds to the first area A1, along the second direction.

The lines L may each be disconnected at a position within the second area A2, such as at a position adjacent to an outer edge of the first area A1 and spaced apart from the outer edge along a second direction (for example, a y-direction) crossing the first direction. A position of disconnection may be included in the second area A2 at a region corresponding to a WA1 range (e.g., disconnection area) shown in FIG. 5. The WA1 range is extended from each of opposing outer edges of the first area A1, along the second direction, and to an outer edge of the second area A2. The WA1 range has a dimension (e.g., width) along the first direction, which corresponds to a dimension along the first direction of the first area A1.

The second area A2 may define a plane. Along the plane, a position where a line L is disconnected may be irregularly or randomly arranged within the WA1 range. In other words, disconnection points of the lines L may be arranged in a zigzag pattern along the WA1 range. Accordingly, lines L adjacent to each other along the second direction may not correspond to each other based on a disconnected point of the lines L.

Each portion of the disconnected lines L may be electrically connected to a driving circuit among the first scan driving circuit 110 and the second scan driving circuit 120.

In an embodiment, a portion of the line L which is disconnected, for example, a left-side portion (e.g., first line portion) relative to the disconnected point of the line L, may be connected to the first scan driving circuit 110. In addition, a remaining portion of the line L which is disconnected, for example, a right-side portion (e.g., second line portion) relative to the disconnected point, may be connected to the second scan driving circuit 120.

Two of the lines L which are arranged parallel to each other along the second direction, may include a first disconnection point and a second disconnection point spaced apart at different distances from the first scan driving circuit 110.

According to an embodiment, disconnection points of the lines L may be irregularly located within the WA1 range such that a difference in brightness between the pixels P located on opposing sides of the disconnected point may be minimized.

Hereinafter, the disclosure will be described in detail with reference to FIG. 6.

A first line L1 may be electrically connected to a plurality of pixels P including a first pixel P1 provided in plurality (e.g., first pixels). A second line L2 may be electrically connected to a plurality of pixels P including a second pixel P2 provided in plurality (e.g., second pixels). In FIG. 5 and FIG. 6, a row may be extended along the x-direction.

The first pixels connected to a same one of the first line L1 and the second pixels connected to a same one of the second line L2 may be arranged side by side along a first row R1. Ends of the first line L1 and the second line L2 which face each other may be spaced apart from each other along the first row R1, at a first spot SP1 (e.g., first disconnection point). Since the first area A1 is arranged closer to one side of the display panel 10, two lines L arranged in a same one row, for example, the first line L1 (e.g., having a first length) and the second line L2 (e.g., having a second length), may have different lengths. The lengths are defined along an extension direction of the lines L, that is, the x-direction. That is, the first length is different from the second length, along a same one row.

A third line L3 may be electrically connected to a plurality of pixels P including a third pixel P3 provided in plurality (e.g., third pixels). A fourth line L4 may be electrically connected to a plurality of pixels P including a fourth pixel P4 provided in plurality (e.g., fourth pixels).

The third pixels connected to a same one of the third line L3 and the fourth pixels connected to a same one of the fourth line L4 may be arranged side by side along a second row R2 parallel to the first row R1. Ends of the third line L3 and the fourth line L4 which face each other, may be spaced apart from each other along the second row R2, at a second spot SP2 (e.g., second disconnection point).

In addition, the fifth line L5 may be electrically connected to a plurality of pixels P including a fifth pixel P5 provided in plurality (e.g., fifth pixels), and a sixth line L6 may be electrically connected to a plurality of pixels P including a sixth pixel P6 provided in plurality (e.g., sixth pixels).

The fifth pixels connected to a same one of the fifth line L5 and the sixth pixels connected to a same one of the sixth line L6 may be arranged side by side along a third row R3 parallel to the first row R1. Ends of the fifth line L5 and the sixth line L6 which face each other may be spaced apart from each other along the third row R3, at a third spot SP3 (e.g., a third disconnection point).

The first spot SP1 may be located in a first column C1 extending crossing, such as orthogonal to, the first row R1. The second spot SP2 may be located in a second column C2 extending crossing, such as orthogonal to, the second row R2. The first column C1 and the second column C2 may be parallel to each other and may not cross each other. The third spot SP3 may be located on a third column C3 extending crossing, such as orthogonal to, the third row R3, and the third column C3 may be parallel to each of the first column C1 and the second column C2.

A virtual extension of each of the first column C1, the second column C2, and the third column C3 may pass through and extend across the first area A1. In other words, each of the first spot SP1 where the first line L1 and the second line L2 are spaced apart from each other, the second spot SP2 where the third line L3 and the fourth line L4 are spaced apart from each other, and the third spot SP3 where the fifth line L5 and the sixth line L6 are spaced apart from each other, may be located in a different column. Each of the first spot SP1, the second spot SP2, and the third spot SP3 may be located within the second area A2 at the WA1 range. In an embodiment, for example, along the first row R1, the first pixel P1 and the second pixel P2 face each other with the first disconnection point therebetween, and along the second row R2, the third pixel P3 and the fourth pixel P4 face each other with the second disconnection point therebetween.

A seventh line L7 may be electrically connected to a plurality of pixels P including a seventh pixel P7 provided in plurality (e.g., seventh pixels). An eighth line L8 may be electrically connected to a plurality of pixels P including an eighth pixel P8 provided in plurality (e.g., eighth pixels). The seventh pixels connected to the seventh line L7 and the eighth pixels connected to the eighth line L8 may be arranged side by side along a fourth row R4 parallel to the first row R1 and passing through the first area A1. Ends of the seventh line L7 and the eighth line L8 which face each other may be spaced apart from each other by the first area A1.

Lines L connected to the pixels P arranged on the left side based on a position of the first area A1, for example, the first line L1, the third line L3, the fifth line L5 and the seventh line L7 (e.g., first lines) in FIG. 6, may extend from the first scan driving circuit 110 arranged on the left side of the third area A3. In addition, lines L connected to the pixels P arranged on the right side based on a position of the first area A1, for example, the second line L2, the fourth line L4, the sixth line L6 and the eighth line L8 (e.g., second lines) in FIG. 6, may extend from the second scan driving circuit 120 arranged on the right side of the third area A3. Each of the lines extended from a respective driving circuit, may terminate at a position corresponding to the first area A1, that is, within the WA1 range, to define disconnection points of the plurality of lines L.

Two adjacent lines, for example, the first line L1 and the third line L3 adjacent along the y-direction, among the lines L extending from the first scan driving circuit 110, may have different lengths in a direction away from the first scan driving circuit 110 (e.g., along the x-direction). In addition, the number of first pixels connected to the first line L1 and the number of third pixels connected to the third line L3, may be different. Two adjacent lines, for example, the second line L2 and the fourth line L4 adjacent along the y-direction, among the lines L extending from the second scan driving circuit 120, may also have different lengths in a direction away from the second scan driving circuit 120 (e.g., along the x-direction) and may be respectively connected to different numbers of pixels P.

A line width is taken orthogonal to the extension direction of a line L. Line widths of two adjacent lines may be different from each other. In an embodiment, for example, the first line L1 may have a first width HL1, the third line L3 may have a third width HL3, and the fifth line L5 may have a fifth width HL5.

The width of each line L may correspond to the length of each line. In an embodiment, for example, when a length of the first line L1 (e.g., first length) from the first scan driving circuit 110 to the first spot SP1 is less than a length of the third line L3 (e.g., third length) from the first scan driving circuit 110 to the second spot SP2, the width HL1 of the first line L1 may be greater than the width HL3 of the third line L3. In addition, when the length of the first line L1 from the first scan driving circuit 110 to the first spot SP1 is greater than a length of the fifth line L5 (e.g., fifth length) from the first scan driving circuit 110 to the third spot SP3, the width HL1 of the first line L1 may be less than the width HL5 of the fifth line L5.

In an embodiment, for example, a planar area (e.g., product of dimensions along the x-direction and the y-direction) occupied by each of the plurality of lines L, may be substantially the same as each other. That is, lengths and line widths of the lines L are inversely proportional to each other such as to define the same planar areas described above. Referring to FIG. 6, for example along the first row R1, the first line L1 has a first length and a first width which define a first planar area of the first line L1, along the second row R2, the third line L3 has a third length and a third width which define a third planar area of the third line L3, the first length of the first line L1 and the third length of the third line L3 are different from each other, and the first planar area and the third planar area are equal to each other.

Figure 7:
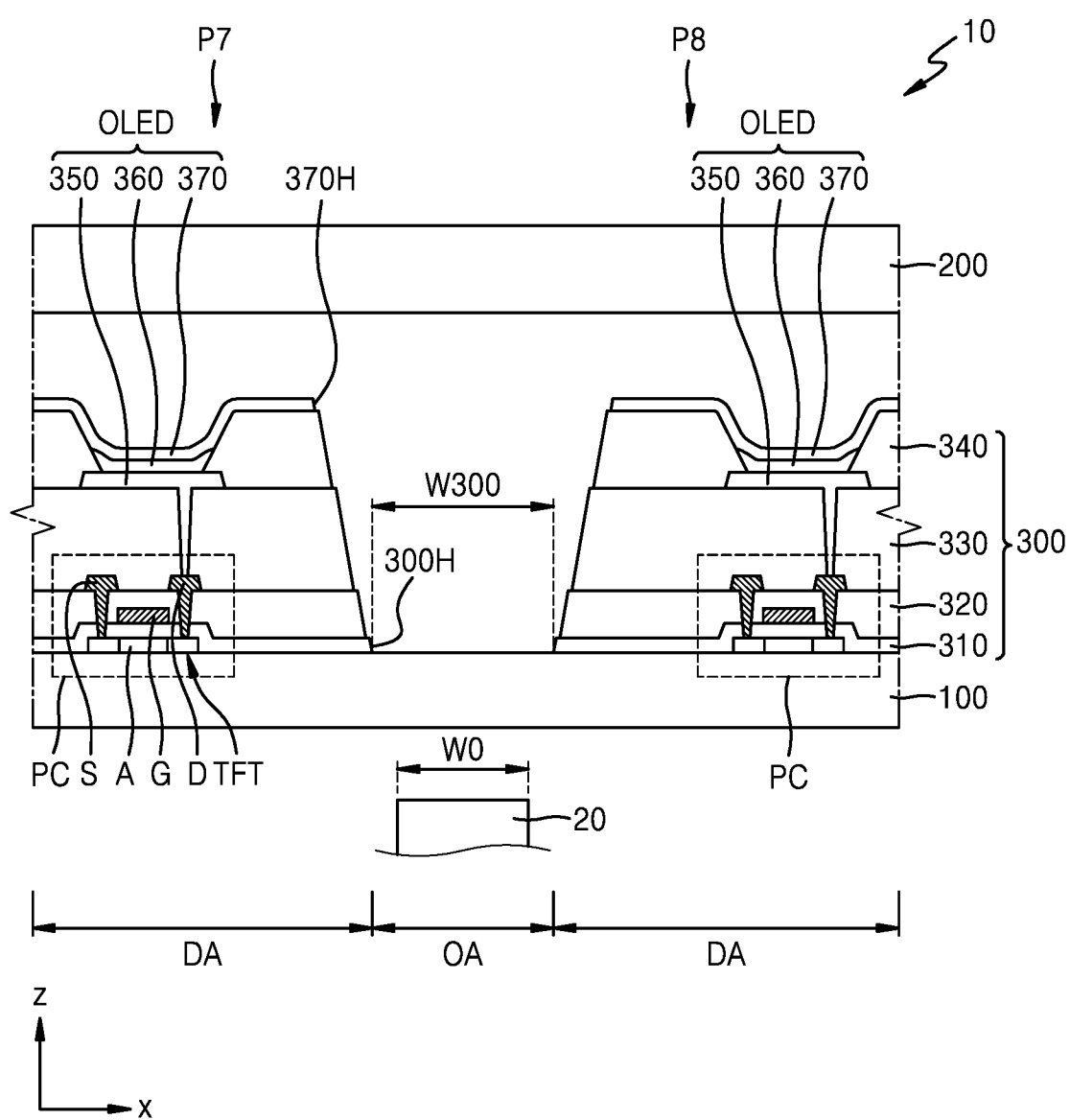
FIG. 7 is an enlarged cross-sectional view illustrating an embodiment of a display panel.

FIG. 7 is an enlarged cross-sectional view illustrating an embodiment of a display panel 10. FIG. 7 may correspond to the cross-sectional view of the seventh pixel P7 and the eighth pixel P8 of FIG. 6.

Referring to FIG. 7, the display panel 10 may include a lower substrate 100, an upper substrate 200, and a display layer 300 (e.g., image display layer) which is between the upper substrate 200 and the lower substrate 100.

The display layer 300 may include a plurality of pixels P including the seventh pixel P7 and the eighth pixel P8. Each of the pixels P may include a pixel circuit PC including a thin-film transistor TFT and a display element OLED which is electrically connected to the pixel circuit PC. The pixels P may be arranged in the second area A2, and two of the pixels P which neighbor the periphery of the first area A1, for example, the seventh pixel P7 and the eighth pixel P8, may be arranged in the second area A2 while being spaced apart from each other by the first area A1.

The thin-film transistor TFT may include a semiconductor layer A including amorphous silicon, polycrystalline silicon, or an organic semiconductor material, a gate electrode G, a source electrode S, and a drain electrode D.

The semiconductor layer A may include the amorphous silicon. In another embodiment, the semiconductor layer A may include an oxide semiconductor including indium (In), gallium (Ga), stanium (Sn), zirconium (Zr), vanadium (V), hafnium (Hf), cadmium (Cd), germanium (Ge), chromium (Cr), titanium (Ti), and/or zinc (Zn). In an embodiment, for example, the semiconductor layer A may include an oxide semiconductor such as indium gallium zinc oxide ("IGZO"), zinc tin oxide ("ZTO"), and zinc indium oxide ("ZIO").

The gate electrode G may be arranged above the semiconductor layer A with a gate insulating layer 310 (e.g., first insulating layer) between the gate electrode G and the semiconductor layer A. The gate electrode G may include molybdenum (Mo), aluminum (Al), copper (Cu), Ti, and may include a single layer or a multilayer. In an embodiment, the gate electrode G may include a single layer of Mo.

The gate insulating layer 310 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$) or the like.

The source electrode S and/or the drain electrode D may be arranged above the gate electrode G with an interlayer insulating layer 320 (e.g., second insulating layer) between the gate electrode G, and the source electrode S and/or the drain electrode D, respectively. The source electrode S and/or the drain electrode D may include Mo, Al, Cu, Ti, or the like, and may include a single layer or a multilayer. In an embodiment, the source electrode S and/or the drain electrode D may include a multilayer of Ti/Al/Ti.

A planarization layer 330 may cover an upper surface of the source electrode S and/or the drain electrode D, and may have a flat top surface such that a pixel electrode 350 may be provided or formed flat.

The planarization layer 330 may include a single layer or a multilayer of an organic material. The planarization layer 330 may include benzocyclobutene ("BCB"), polyimide, hexamethyldisiloxane ("HMDSO"), a general commercial polymer such as poly(methyl methacrylate) ("PMMA") or polystyrene ("PS"), a polymer derivative having a phenol group, an acrylic polymer, an imide polymer, an aryl ether polymer, an amide polymer, a fluorine polymer, a p-xylene polymer, a vinyl alcohol polymer, and a mixture thereof. The planarization layer 330 may include an inorganic material.

The planarization layer 330 may silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$) or the like. When the planarization layer 330 includes an inorganic material, a chemical planar polishing may be performed. The planarization layer 330 may include both of an organic material and an inorganic material.

The pixel electrode 350 may be a (semi)transparent electrode or a reflective electrode. In embodiments, the pixel electrode 350 may include a reflective material layer such as a film including silver (Ag), magnesium (Mg), Al, platinum (Pt), palladium (Pd), gold (Au), nickel (Ni), neodymium (Nd), iridium (Ir), Cr, a combination thereof, or the like, and a transparent or semi-transparent electrode layer provided or formed on the reflective material layer. The transparent or semi-transparent electrode layer may include at least one selected from indium tin oxide ("ITO"), indium zinc oxide ("IZO"), zinc oxide ("ZnO"), indium oxide ($In_2O_3$) indium gallium oxide ("IGO"), and aluminum zinc oxide ("AZO")". In embodiments, the pixel electrode 350 may include a stacked structure with ITO/Ag/ITO.

A pixel defining film 340 (e.g., pixel defining layer) may be arranged on the planarization layer 330. The pixel defining film 340 may define an emission area (e.g., a light emission area) of a pixel P by defining an opening corresponding to a portion of the pixel electrode 350. In addition, the pixel defining film 340 may increase a distance between an edge of the pixel electrode 350 and an opposite electrode 370 above the pixel electrode 350 to prevent an electrical arc or the like from being generated at the edge of the pixel electrode 350. The pixel defining film 340 may include or be formed of an organic insulating material such as polyimide, polyamide, acrylic resin, BCB, HMDSO, and phenol resin, such as using a spin coating method or the like.

An intermediate layer 360 of the display element OLED may include an organic emission layer (e.g., light emission layer). The organic emission layer may include an organic material including a fluorescent or phosphorescent material with which colored light such as red, green, blue, or white light is emitted. The organic emission layer may include a relatively low-molecular-weight organic material or a polymer organic material, and a functional layer such as a hole transport layer ("HTL"), a hole injection layer ("HIL"), an electron transport layer ("ETL"), an electron injection layer ("EIL"), or the like may be further selectively arranged above or below the organic emission layer. The intermediate layer 360 may be discretely arranged as patterns respectively corresponding to each of a plurality of pixel electrodes 350. However, the disclosure is not limited thereto. The intermediate layer 360 may be variously changed such as including a single-body layer over each of the plurality of pixel electrodes 350.

The opposite electrode 370 may be a transparent electrode or a reflective electrode. In an embodiment, the opposite electrode 370 may be a transparent or semi-transparent electrode, and may include a metal material in a thin film having a relatively small work function including lithium (Li), calcium (Ca), lithium fluoride (LiF)/Ca, LiF/Al, Al, Ag, Mg, and a combination thereof. In addition, a transparent conductive oxide ("TCO") film such as ITO, IZO, ZnO, $In_2O_3$, or the like may be further arranged on the metal thin film. The opposite electrode 370 may be arranged on the intermediate layer 360 and the pixel defining film 340. The opposite electrode 370 may be provided or formed in a single body to cover a plurality of display elements OLED, and may include or define a hole 370H corresponding to the first area A1.

Referring to FIG. 7, the pixel circuit PC and/or the display element OLED may not be arranged in the first area A1. The pixel circuit PC of each of the seventh pixel P7 and the eighth pixel P8 which are neighboring the periphery of the first area A1, may be spaced apart from each other by a first hole 300H corresponding to the first area A1. In addition, the display elements OLED of the seventh pixel P7 and the eighth pixel P8 may be apart from each other around the first hole 300H corresponding to the first area A1.

The first hole 300H may be provided or formed through thicknesses of a plurality of layers included in the display layer 300. In an embodiment, the first hole 300H may penetrate each layer within the stacked structure including the gate insulating layer 310, the interlayer insulating layer 320, the planarization layer 330, the pixel defining film 340 and the opposite electrode 370. In an embodiment, for example, the first hole 300H may include holes defined in each of the gate insulating layer 310, the interlayer insulating layer 320, the planarization layer 330, the pixel defining film 340, and the opposite electrode 370, which overlap or are aligned with each other.

A width W300 (e.g., first width) of the first hole 300H may be defined by a width of a hole having the smallest size among the holes respectively defined in the gate insulating layer 310, the interlayer insulating layer 320, the planarization layer 330, the pixel defining film 340, and the opposite electrode 370. The width W300 may be a minimum distance between facing side surfaces of a layer within the stacked structure defining the first hole 300H. In this regard, although FIG. 7 illustrates that a width of the hole in the gate insulating layer 310 defines the first hole 300H, in another embodiment, the planarization layer 330 may cover facing side surfaces of the gate insulating layer 310 and the interlayer insulating layer 320 thereunder, at the first hole 300H, and the first hole 300H may be defined by a width of a hole defined in the planarization layer 330.

The width W300 of the first hole 300H may be greater than a width W0 (e.g., second width) of the component 20 corresponding to the first area A1 and included below the lower substrate 100. The width W0 may be a maximum dimension of the component 20, in a same direction along which the width W300 is taken. The first hole 300H may be provided or formed so as not to absorb or reflect light emitted from the component 20 and/or light incident to the component 20.

Pixels P according to embodiments of the present disclosure may have the same structure as the seventh pixel P7 or the eighth pixel P8 described with reference to FIG. 7.

According to various embodiments of the present disclosure, a display device 1 maximizing a display area DA and improving a display feature may be provided.

It should be understood that embodiments described herein should be considered in a descriptive sense only and not for purposes of limitation. Descriptions of features within each embodiment should typically be considered as available for other similar features in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
a substrate comprising:
a display area including:
a first non-display area within the display area and at which light is transmittable to and from the substrate, and
a plurality of pixels comprising:
a first pixel and a second pixel arranged along a first row extended along a first direction,
a third pixel and a fourth pixel arranged along a second row parallel to the first row, and
each of the first and second rows adjacent to the first-non-display area along a second direction crossing the first direction;
a first column defined perpendicular to the first row; and
a second column defined parallel to the first column and spaced apart from the first column,
wherein the first column and the second column each pass through the first non-display area; and
a plurality of lines on the substrate and comprising:
a first line extending along the first row and electrically connected to the first pixel,
a second line extending along the first row and electrically connected to the second pixel,
a first disconnection point at which the first line and the second line are spaced apart from each other along the first row,
a third line extending along the second row and electrically connected to the third pixel,
a fourth line extending along the second row and electrically connected to the fourth pixel, and
a second disconnection point at which the third line and the fourth line are spaced apart from each other along the second row,
wherein the first disconnection point corresponds to the first column and the second disconnection point corresponds to the second column.

2. The display device of claim 1, further comprising a first scan driving circuit and a second scan driving circuit facing each other with the display area therebetween,
wherein
the first line and the third line each extend from the first scan driving circuit, and
the second line and the fourth line each extend from the second scan driving circuit.

3. The display device of claim 2, wherein
the substrate further comprises a second non-display area outside of the display area, and
the first scan driving circuit and the second scan driving circuit are in the second non-display area.

4. The display device of claim 1, further comprising a scan line and a light emission control line electrically connected to the plurality of pixels, on the substrate,
wherein the plurality of lines further comprises the scan line provided in plural, the light emission control line provided in plural, or the scan line and the light emission control line.

5. The display device of claim 1, wherein
within the display area, the plurality of pixels further comprises a fifth pixel and a sixth pixel arranged along a third row parallel to the first row,
the substrate further comprises a third column defined parallel to and spaced apart from the first column, the third column passing through the first non-display area, and
within the display area, the plurality of lines further comprises:

a fifth line extending along the third row and electrically connected to the fifth pixel,
a sixth line extending along the third row and electrically connected to the sixth pixel, and
a third disconnection point at which the fifth line and the sixth line are spaced apart from each other along the third row,
wherein the third disconnection point corresponds to the third column.

6. The display device of claim 1, wherein within the display area,
the plurality of pixels further comprises a seventh pixel and an eighth pixel arranged along a fourth row parallel to the first row, and
the seventh pixel and the eighth pixel are spaced apart from each other with the first non-display area therebetween.

7. The display device of claim 6, wherein the fourth row passes through the first non-display area.

8. The display device of claim 1, wherein within the display area,
along the first row, the first line has a first length,
along the second row, the third line has a third length, and
the first length of the first line and the third length of the third line are different from each other.

9. The display device of claim 1, wherein within the display area,
along the first row, the first line has a first length and the second line has a second length, and
the first length of the first line and the second length of the second line are different from each other.

10. The display device of claim 1, wherein within the display area,
the first pixel is provided in plurality comprising a number of first pixels connected to the first line,
the third pixel is provided in plurality comprising a number of third pixels connected to the third line, and
the number of first pixels connected to the first line is different from the number of third pixels connected to the third line.

11. The display device of claim 1, wherein within the display area, in a top plan view,
along the first row, the first line has a first length and a first width which define a first planar area of the first line,
along the second row, the third line has a third length and a third width which define a third planar area of the third line,
the first length of the first line and the third length of the third line are different from each other, and
the first planar area and the third planar area are equal to each other.

12. The display device of claim 1, wherein
along the first row, the first pixel and the second pixel face each other with the first disconnection point therebetween, and
along the second row, the third pixel and the fourth pixel face each other with the second disconnection point therebetween.

13. The display device of claim 1, wherein
each of the plurality of pixels comprises a display element comprising a pixel electrode, an opposite electrode, and a light emission layer which is between the pixel electrode and the opposite electrode, and
the opposite electrode comprises a single body corresponding to each of the plurality of pixels within the display area and defines a hole corresponding to the first non-display area.

14. A display device comprising:
a substrate comprising:
a display area including a plurality of pixels; and
a first non-display area within the display area and at which light is transmittable to and from the substrate; and
a plurality of lines on the substrate and electrically connected to the plurality of pixels,
wherein within the display area,
the plurality of lines are extended along a first direction and parallel to each other, are arranged adjacent to each other along the first direction and along a second direction crossing the first direction, and are adjacent to the first-non-display area along the second direction,
the plurality of lines which are adjacent to the first-non-display area along the second direction and adjacent to each other along the first direction, are spaced apart from each other along the first direction to define disconnection points, and
each of the disconnection points corresponds to the first non-display area, along the second direction.

15. The display device of claim 14, wherein within the display area, the disconnection points are arranged in a zigzag pattern.

16. The display device of claim 14, further comprising a first scan driving circuit and a second scan driving circuit facing each other with the display area therebetween,
wherein the plurality of lines which are adjacent to each other along the first direction comprises:
first lines each extended from the first scan driving circuit, and
second lines each extended toward a respective first line, from the second scan driving circuit,
wherein the first lines are respectively spaced apart from the second lines to define the disconnection points.

17. The display device of claim 16, wherein
the substrate further comprises a second non-display area outside of the display area, and
the first scan driving circuit and the second scan driving circuit are in the second non-display area.

18. The display device of claim 16, wherein within the display area,
the first lines are arranged along the second direction,
two first lines which are adjacent to each other along the second direction respectively have lengths taken from the first scan driving circuit to a respective disconnection point, and
the lengths of the two first lines which are adjacent to each other along the second direction, are different from each other.

19. The display device of claim 16, wherein within the display area, in a top plan view,
the first lines are arranged along the second direction, and
for two first lines which are adjacent to each other along the second direction,
each first line has a first length and a first width which define a first planar area, and
first planar areas of the two first lines which are adjacent to each other along the second direction, are equal to each other.

20. The display device of claim 14, further comprising a scan line and a light emission control line electrically connected to the plurality of pixels, on the substrate, wherein the plurality of lines further comprises the scan line provided in plural, the light emission control line provided in plural, or the scan line and the light emission control line.

* * * * *